US011795564B2

(12) United States Patent
Curran et al.

(10) Patent No.: US 11,795,564 B2
(45) Date of Patent: Oct. 24, 2023

(54) DYE SOLUTION ALTERNATIVES FOR REDUCED DYE UPTAKE IN ANODIZED LAYERS

(71) Applicant: Apple Inc., Cupertino, CA (US)

(72) Inventors: James A. Curran, Morgan Hill, CA (US); James A. Dean, Palo Alto, CA (US); Todd S. Mintz, San Jose, CA (US)

(73) Assignee: APPLE INC., Cupertino, CA (US)

( * ) Notice: Subject to any disclaimer, the term of this patent is extended or adjusted under 35 U.S.C. 154(b) by 1021 days.

(21) Appl. No.: 16/104,477

(22) Filed: Aug. 17, 2018

(65) Prior Publication Data

US 2020/0056300 A1 Feb. 20, 2020

(51) Int. Cl.
*C25D 11/24* (2006.01)
*H05K 5/02* (2006.01)
*H05K 5/04* (2006.01)
*B32B 15/00* (2006.01)

(52) U.S. Cl.
CPC ......... *C25D 11/243* (2013.01); *H05K 5/0243* (2013.01); *H05K 5/04* (2013.01); *B32B 15/00* (2013.01); *Y10T 428/24917* (2015.01)

(58) Field of Classification Search
CPC ..... B32B 15/00; C25D 11/243; C25D 11/246; G06F 1/1656; H05K 5/0243; H05K 5/04; Y10T 428/24917
See application file for complete search history.

(56) References Cited

U.S. PATENT DOCUMENTS

| 3,016,293 | A | 1/1962 | Alexander |
| 7,122,107 | B2 | 10/2006 | Kia et al. |
| 7,931,939 | B2 | 4/2011 | Yamaguchi |
| 2011/0056836 | A1 | 3/2011 | Tatebe et al. |
| 2011/0284383 | A1* | 11/2011 | Cabot ............ C23C 22/74 205/50 |
| 2012/0088033 | A1* | 4/2012 | Sheehy ............ B05D 7/14 427/402 |
| 2016/0089834 | A1 | 3/2016 | Mag et al. |
| 2016/0362808 | A1 | 12/2016 | Yamamoto et al. |
| 2017/0016136 | A1 | 1/2017 | Yamamoto et al. |
| 2017/0107628 | A1 | 4/2017 | Trinidad et al. |

(Continued)

FOREIGN PATENT DOCUMENTS

| CN | 101812713 A | 8/2010 |
| CN | 105063718 A | 11/2015 |

(Continued)

OTHER PUBLICATIONS

Abdel-Salam et al., "Characterization of the hard anodizing layers formed on 2014-T3 Al alloy, in sulphuric acid electrolyte containing sodium lignin sulphonate," Egyptian Journal of Petroleum, Aug. 9, 2017 <https://doi.org/10.1016/j.ejpe.2017.07.014>, 8 pages.

*Primary Examiner* — Sathavaram I Reddy
(74) *Attorney, Agent, or Firm* — Dorsey & Whitney LLP (57) ABSTRACT

This application relates to an enclosure for a portable electronic device. The enclosure includes an aluminum alloy substrate and an anodized layer overlaying and formed from the aluminum alloy substrate. The anodized layer includes pores, where the pores include (i) dye particles that impart the anodized layer with a color, and (ii) divalent metal cations.

15 Claims, 8 Drawing Sheets

(56) References Cited

U.S. PATENT DOCUMENTS

| | | | |
|---|---|---|---|
| 2017/0121836 A1 | 5/2017 | Tatebe et al. | |
| 2017/0121837 A1* | 5/2017 | Tatebe | C25D 11/08 |
| 2017/0121838 A1* | 5/2017 | Tatebe | C25D 11/08 |
| 2017/0356097 A1 | 12/2017 | Eagerton | |
| 2018/0023210 A1 | 1/2018 | Akimoto et al. | |
| 2018/0080138 A1 | 3/2018 | Curran et al. | |
| 2019/0032237 A1 | 1/2019 | Kim et al. | |

FOREIGN PATENT DOCUMENTS

| | | |
|---|---|---|
| CN | 105506704 A | 4/2016 |
| CN | 107815716 A | 3/2018 |
| CN | 108350598 A | 7/2018 |
| WO | 9001079 A1 | 2/1990 |
| WO | 2018145780 A1 | 8/2018 |

\* cited by examiner

DYE SOLUTION ALTERNATIVES FOR REDUCED DYE UPTAKE IN ANODIZED LAYERS

FIELD

The described embodiments relate generally to techniques for slowing or reducing dye uptake while dyeing anodized parts. More particularly, the described embodiments relate to systems and methods for using divalent metal cations while dyeing anodized parts in order to delay uptake of dyes into the anodized parts and increase corrosion resistance of the dyed anodized parts.

BACKGROUND

Enclosures for portable electronic devices can include an anodized layer that may be dyed in different colors so as to impart these enclosures with an aesthetically pleasing appearance. In particular, uniformly dyeing the anodized layers of these enclosures in a light color shade is challenging due to the solubility limit of dye particles used to impart the light color shade. Indeed, a light concentration of dye particles results in patchy dye uptake and non-uniform color uniformity of these enclosures, while a higher concentration of dye particles results in over-saturation of color across multiple enclosures. Moreover, the dyeing process should not open these anodized layers to greater susceptibility to corrosion. Therefore, there is a need to delay the uptake of dye particles to the anodized layers of multiple enclosures so as to provide the necessary control to provide light shades of color as well as increase corrosion resistance.

SUMMARY

This paper describes various embodiments that relate to techniques for dyeing anodized parts. In particular, the various embodiments relate to systems and methods for using divalent metal cations while dyeing anodized parts in order to slow or reduce uptake of dyes into the anodized parts and increase corrosion resistance of the dyed anodized parts.

According to some embodiments, an enclosure for a portable electronic device is described. The enclosure includes an aluminum alloy substrate and an anodized layer overlaying and formed from the aluminum alloy substrate. The anodized layer includes pores, where the pores include (i) dye particles that impart the anodized layer with a color, and (ii) divalent metal cations.

According to some embodiments, an enclosure for a portable electronic device having a dyed color is described. The enclosure includes a metal substrate and a metal oxide layer overlaying the metal substrate, the metal oxide layer including pores. The metal oxide layer includes (i) dye particles and anions that are bonded to binding sites of pore walls of the pores, and (ii) divalent metal cations that are dispersed within the pores, wherein the anions occupy a number of the binding sites of the pore walls, thereby imparting the metal oxide layer with the dyed color having an L* value using a CIE L*a*b* color space between 50 to 100.

According to some embodiments, a method for dyeing an enclosure for a portable electronic device, the enclosure including a metal substrate and a metal oxide layer overlaying the metal substrate, is described. The method includes forming a dyed metal oxide layer by exposing the metal oxide layer to a dye solution that includes (i) dye particles, and (ii) divalent metal cation—anion molecules, thereby causing divalent metal cations to be dispersed within pores of the metal oxide layer, wherein the dyed metal oxide layer has a lower ionic conductivity than the metal oxide layer.

Other aspects and advantages of the invention will become apparent from the following detailed description taken in conjunction with the accompanying drawings which illustrate, by way of example, the principles of the described embodiments. This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein set forth techniques for delaying uptake of dye particles by anodized parts so as to impart dye uniformity across multiple dyed anodized parts, particularly in light shades where the dye time must be short to limit dye uptake. For instance, during a color dyeing process, multiple flights bars of anodized parts (e.g., thousands or tens of thousands of parts, etc.) are dyed using a color dye bath. To achieve a light color, as opposed to a darker, more saturated color, the immersion time for the anodized parts in the dye solution will necessarily be short—for example, about 60 seconds. Additionally, when dyeing a large quantity of the anodized parts in a single dye bath, there may be up to a 20 second difference in immersion time between those anodized parts at the bottom of the dye bath and those anodized parts at the top of the dye bath. Consequently, this 20 second difference in immersion time can lead to a color variation of >10% between these dyed anodized parts. Furthermore, this discrepancy becomes even more apparent when using light color dyes (e.g., tartrazine yellow, quinolone yellow, etc.) since the lighter shades of color are more prone to produce patchy and non-uniform dye uptake across these dyed anodized parts.

One attempt at fixing the color variation involves limiting or slowing dye uptake into pore structures of these anodized parts by incorporating a very low concentration of dye particles (i.e., <0.1 g/L). However, this approach is undesirable in that it tends to produce low uniformity and results in patchy dye uptake into pore structures of the anodized layer. A widely employed means of slowing dye uptake—adopted from textile dyeing—is to add sodium sulfate to a dye solution. The sulfate ions compete with dye in their absorption onto the metal oxide surface, and dye uptake rates can be reduced by a factor of 2-3. However, even with sodium sulfate concentrations equal to dye concentrations at ~1 g/L, light shades of color may still necessitate dye immersion times of no more than about 1 minute.

Moreover, the use of sodium sulfate to inhibit or slow dye uptake is generally unsuitable for consumer-grade portable electronic devices. Indeed, the presence of sodium sulfate may be undesirable as sodium being incorporated into the anodized layers of these enclosures. Indeed, sodium ions may diffuse into the anodized layer during the dyeing process. As these enclosures are exposed to long-term immersion in a range of fluids (e.g., chlorinated water, ocean water, etc.), the combination of high and low pH water, chlorides, salt, and cycles of heat and humidity may break down the metal oxide material of the anodized layer. Although the pores of the anodized layer may be hydrothermally sealed, the presence of the sodium ions within the anodized layer may actually increase ionic conductivity, thereby allowing chloride ions to pass through the anodized layer and penetrate the underlying metal substrate. Moreover, the presence of sodium ions actually reduces the performance of the hydrothermal seal over prolonged usage. Indeed, the addition of sodium sulfate to the dye solution may increase ionic conductivity of the anodized layer, thereby degrading the hydrothermal seal performance by as much as 50% (as measured by reduction in impedance when samples are subject to 24 hours in a salt solution).

Accordingly, the techniques described herein involve incorporating divalent metal cations, such as zinc sulfate as a source of sulfate ions, where zinc is a divalent (in contrast to sodium which is a monovalent). Thus, equivalent concentrations of the active anionic species (sulfate ions) can be achieved in a dye solution that utilizes only half of the corresponding cations (e.g., zinc). This, in turn, leads to lower levels of cation retention in the sealed metal oxide layer and reduces ionic conductivity throughout the metal oxide layer. Moreover, zinc sulfate is also just as or more effective than sodium sulfate in slowing dye uptake into pores because zinc sulfate also provides a source of the sulfate ions. Additionally, the use of zinc sulfate as a source of sulfate ions reduces ionic conductivity in the anodized layer, thereby improving corrosion resistance of dyed anodized metal parts.

According to some embodiments, an enclosure for a portable electronic device is described. The enclosure includes an aluminum alloy substrate and an anodized layer overlaying and formed from the aluminum alloy substrate. The anodized layer includes pores, where the pores include (i) dye particles that impart the anodized layer with a color, and (ii) divalent metal cations.

As used herein, the terms anodic film, anodized film, anodic layer, anodized layer, anodic oxide coating, anodic layer, anodic oxidized layer, metal oxide layer, oxide film, oxidized layer, and oxide layer can be used interchangeably and refer to any appropriate oxide layers. The oxide layers are formed on metal surfaces of a metal substrate. The metal substrate can include any of a number of suitable metals or metal alloys. In some embodiments, the metal substrate can include aluminum, and the aluminum is capable of forming an aluminum oxide when oxidized. In some embodiments, the metal substrate can include an aluminum alloy. As used herein, the terms part, layer, segment, and section can also be used interchangeably where appropriate.

These and other embodiments are discussed below with reference to FIGS. 1, 2A-2E, and 3-8. However, those skilled in the art will readily appreciate that the detailed description given herein with respect to these figures is for explanatory purposes only and should not be construed as limiting.

Figure 1:
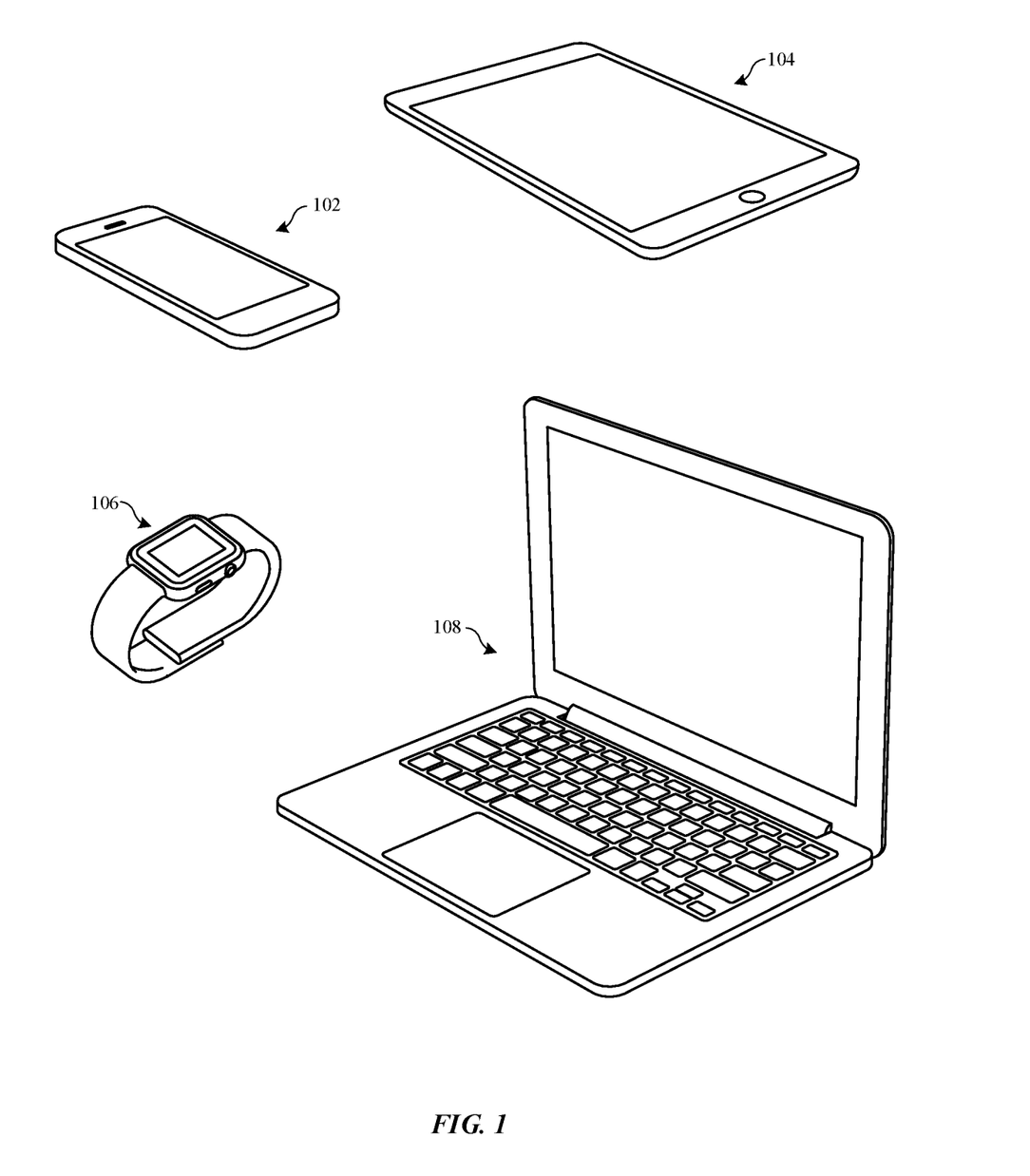
FIG. 1 illustrates perspective views of various portable electronic devices having metallic surfaces that may be dyed using the dye solutions described herein, in accordance with some embodiments.

FIG. 1 illustrates various portable electronic devices that can be processed using the techniques as described herein. The techniques as described herein can be used to process metallic surfaces (e.g., metal oxide layers, etc.) of enclosures of the portable electronic devices. In some examples, the techniques described herein may be used to color the metallic surfaces by causing dye particles to become absorbed within the metallic surfaces. FIG. 1 illustrates a smartphone 102, a tablet computer 104, a smartwatch 106, and a portable computer 108. According to some embodiments, the metallic surfaces can refer to a metal oxide layer that overlays a metal substrate. In some examples, the metal oxide layer is formed from the metal substrate during an anodization/oxidation process. The metal oxide layer can function as a protective coating to protect the metal substrate, for example, when these portable devices are dropped, scratched, chipped, or abraded.

In some examples, such as where the metal substrate includes aluminum or an aluminum alloy, the metal oxide layer includes pore structures (or pores) that are formed through the metal oxide layer and can extend from an external surface of the metal oxide layer and towards a barrier layer that separates the metal oxide layer from the underlying metal substrate.

Additionally, each of the pore structures of the metal oxide layer is capable of receiving dye particles which can imbue the metal oxide layer with a specific color that corresponds to the dye particles. In particular, the metal oxide layer may be dyed prior to sealing the metal oxide layer. Dyeing the metal oxide layer enables the metallic surface to be imbued with a wider range of colors. In particular, the pore structures may have a diameter between about 20 nm to about 40 nm, which is large enough to receive the dye particles. Several parameters may influence and control uptake of dye particles into the pore structures which may include dye concentration, temperature of dye solution, and dyeing time, as will be described in greater detail herein. Subsequent to dyeing the metallic surface, the pore structures are sealed so that the dye particles are permanently and physically retained within the pore structures. In some examples, the color of the metal oxide layer may be characterized according to L*a*b* color-opponent dimension values. The L* color opponent dimension value is one variable in an L*a*b* color space. In general, L* corresponds to an amount of lightness. L*=0 represents the darkest black while L*=700 represents white.

FIGS. 2A-2D illustrate cross-sectional views of a metal part 200 undergoing various processes for controlling dye uptake, in accordance with some embodiments. In some embodiments, the metal part 200 has a near net shape of a final part, such as the enclosures of the portable electronic devices 102, 104, 106, and 108.

Figure 2A:
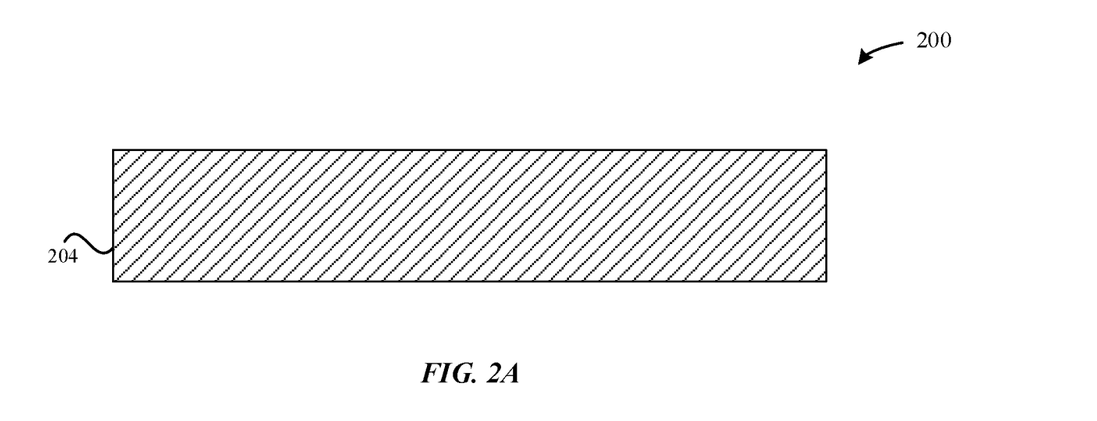
FIGS. 2A-2D illustrate cross-sectional views of a metal part undergoing various processes for controlling dye uptake, in accordance with some embodiments.

FIG. 2A illustrates the metal part 200 prior to undergoing an anodization process. In some examples, the metal part 200 may correspond to the metal substrate 204. The metal substrate 204 may have any thickness that is suitable for providing sufficient hardness and rigidity to protect electronic component(s) that are carried within the portable electronic device. The metal substrate 204 may be subject to one or more pre-anodization processes. In some examples, the pre-anodization processes of the metal substrate 204 include at least one of polishing, texturizing, buffering, and the like. Beneficially, in this manner, surface(s) of the metal substrate 204 may assume any number of desired surface geometries and surface finishes. In some examples, the metal substrate 204 is a three-dimensional structure having a height, width, and depth, and the metal substrate 204 can have any type of geometry that is suitable for forming an overlaying metal oxide layer, as will be described in greater detail herein. In particular, the geometry of the metal substrate 204 is characterized as rectangular, polygonal, circular, beveled edges, angular edges, elliptical, etc.

Figure 2B:
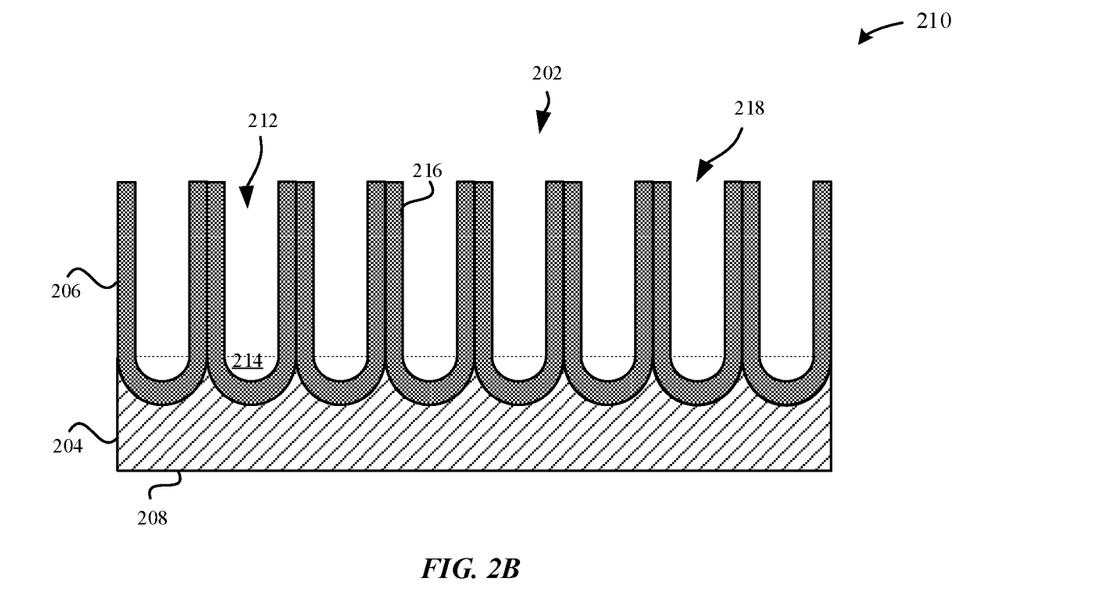

FIG. 2B illustrates an anodized part 210, in accordance with some embodiments. For example, the anodized part 210 corresponds to the metal substrate 204 after undergoing the anodization process. As illustrated in FIG. 2B, a metal oxide layer 206 is formed from and overlays the metal substrate 204. The metal oxide layer 206 may include an external surface 202, where the external surface 202 of the metal oxide layer 206 may be generally parallel to a bottom surface 208 of the metal substrate 204. In some examples, the metal oxide layer 206 is formed as a result of an electrolytic anodizing process. In particular, during the electrolytic anodizing process, a portion of the metal substrate 204 is converted or consumed by the conversion to the metal oxide layer 206.

According to some examples, the metal oxide layer 206 has a thickness between about 1 micron and about 50 microns. In some examples, the thickness is between about 8 microns and about 20 microns.

According to some embodiments, the metal oxide layer 206 includes pore structures 212 that extend from the external surface 202 of the anodized part 210 towards the metal substrate 204. The pore structures 212 may include bottom surfaces 214. The pore structures 212 are defined by pore walls 216 characterized as having generally columnar shapes that are elongated in a direction generally perpendicular to a central plane of the external surface 202 of the anodized part 210. According to some examples, the pore structures 212 range in diameter from about 10 nm to about 500 nm. In some examples, the pore structures 212 have diameters between about 20 nm to about 50 nm. The pore structures 212 include openings 218 that may be sealed via a sealing process, as described in greater detail herein.

Figure 2C:
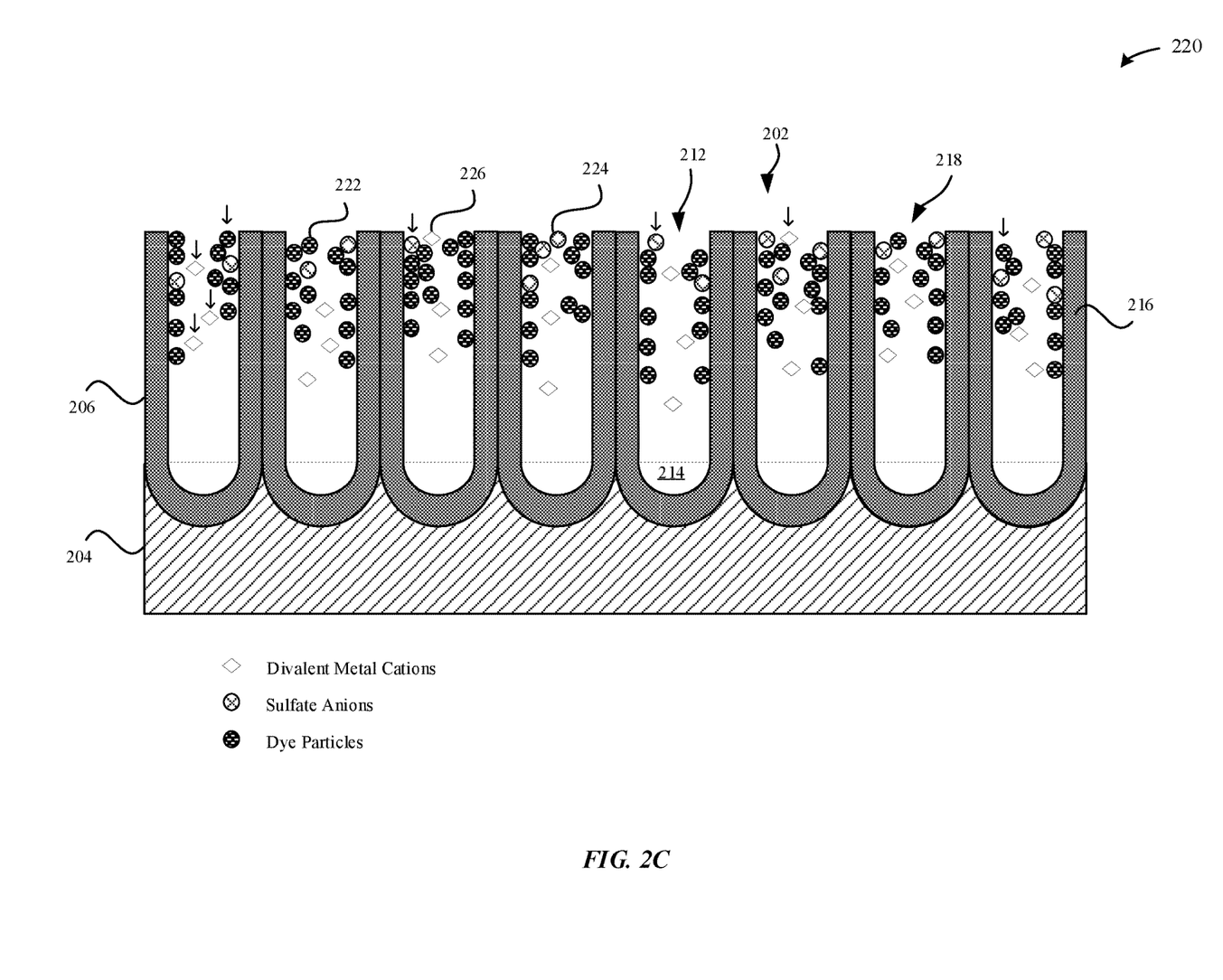

FIG. 2C illustrates a dyed part 220 prior to undergoing a sealing process, in accordance with some embodiments. In some examples, the dyed part 220 corresponds to the anodized part 210 subsequent to undergoing a dyeing process. As illustrated in FIG. 2C, the metal oxide layer 206 includes dye particles 222 that are absorbed within the pore structures 212. In particular, the anodized part 210 is exposed to a dye solution (not illustrated) during the dyeing process. The dye solution includes dye particles 222. The dye particles 222 may be aqueous organic dyes that are capable of binding to numerous sites along the pore walls 216. In some examples, these sites include aluminum or hydrated aluminum gel of the aluminum oxide of the pore walls 216. In order to limit the number of sites for absorption of the dye particles 222, the dye solution may include anions 224, such as sulfate ($SO_4^{2-}$) ions, phosphate ions, silicate ions, and the like, which are also capable of competing with the dye particles 222 for binding to these sites of the pore walls 216. Thus, there are a limited number of sites along the pore walls 216 that can receive the dye particles 222. In some examples, these anions 224 may include at least one of acetates, oxalates, citrates, carbonates, or nitrates. The dye solution may include a combination of the dye particles 222 and a source of the sulfate ions. In particular, the dye solution may include $ZnSO_4$ as a source of the sulfate ions. In particular, zinc ($Zn^{2+}$) is a divalent metal cation having a valence of two, which is to mean that an equivalent concentration of the active anionic species (sulfate ions) can be incorporated into the dye solution with only half the concentration of corresponding cations (i.e., $Zn^{2+}$) as compared to cations from an equivalent sulfate concentration achieved using the conventional approach of sodium sulfate as the dye bath additive. The source of the sulfate ions (e.g., $ZnSO_4$) includes divalent metal cations 226, which may be absorbed into the pore structures 212.

As illustrated in FIG. 2C, subsequent to the dyeing process, the divalent metal cations 226 are non-uniformly distributed throughout the pore structures 212. In some embodiments, the concentration of the divalent metal cations 226 is greater at the openings 218 of the pore structures 212 and the concentration tapers off towards the bottom surfaces 214 of the pore structures 212. In some examples, the divalent metal cations 226 may have a peak concentration at the external surface 202 of the metal oxide layer 206 of about 5 wt %. In some examples, the concentration of divalent metal cations 226, such as zinc, at the external surface 202 is between about 1 wt % to about 10 wt %. The tapering off of the peak concentration of the divalent metal cations 226 further away from the external surface 202 may be due to the distance by which the divalent metal cations 226 must be absorbed into the pore structures 212. The presence of the divalent metal cations 226 can be detected using fluorescent imaging or x-ray analysis.

It should be noted that although the pore structures 212 may include divalent metal cations from another source (e.g., the metal substrate 204), FIG. 2C illustrates generally the presence of divalent metal cations 226 from the source of sulfate ions from the dye solution. Indeed, the non-uniform distribution of the divalent metal cations 226 within the pore structures 212 exemplifies that these divalent metal cations 226 illustrated in FIG. 2C originate from the dye solution. In contrast, other divalent metal cations originating from the metal substrate 204 may lead to uniform distribution of the other divalent metal cations within the pore structures 212. However, it should be noted that other divalent metal cations from another source (i.e., not the dye solution) will have a negligible effect on the peak concentration of the divalent metal cations 226 captured at the metal oxide layer 206. Indeed, if $ZnSO_4$ in the dye solution is the source of the sulfate ions, then the peak concentration of zinc at the metal oxide layer 204 will be adjusted by at most by 1%≥X because of the presence of zinc elements within the metal substrate 204. For example, if the metal substrate 204 includes 5.5% zinc, there would be a maximum of 1% of zinc incorporated into the metal oxide layer 204 from the metal substrate 204 as a result. Furthermore, the concentration of zinc originating from the metal substrate 204 would be greater at the lower surface of the metal oxide layer 206 (i.e., that is adjacent to the barrier layer) before dropping off significantly towards the external surface 202 of the dyed part 220.

According to some examples, the dye solution includes between about 0.1 g/L to about 1 g/L of $ZnSO_4$. In some examples, the dye solution includes between about 0.1 g/L to less than 10 g/L of $ZnSO_4$. Beneficially, the low concentration of the source of sulfate ions within the dye solution can slow the uptake of the dye particles 222 into the pore structures 212. By slowing the uptake of the dye particles 222, there is increased control of the color and uniformity of color among multiple anodized parts that are exposed as a single batch to the dye solution. It should be noted that a dye solution with a concentration of the source of sulfate ions of less than 0.1 g/L produces less uniformity of color and patchy uptake of dye particles 222 at the pore walls 216 due to solution flow dynamics and local depletion of the dye solution. Additionally, a concentration of greater than 1 g/L of the source of sulfate ions is not ideal for producing uniform color across multiple parts in a single batch due to intense color saturation of the dye particles 222.

In some examples, the divalent metal cations 226 may include at least one of barium, calcium, cobalt, copper, germanium, iron, lanthanum, magnesium, manganese, nickel, strontium, tin, uranium, vanadium, yttrium or zinc. Additionally, divalent metal cations 226 having a large radius (e.g., barium, etc.) may be even more beneficial due to their lower mobility to pass through the pore structures 212. Furthermore, it should be noted that although anions 224 are effective at inhibiting uptake of dye particles into pore structures, other anions (e.g., phosphates, silicates, etc.) should be considered as effective substitutes for anions 224 for reducing uptake of dye particles into the pore structures. Although these other anions may inhibit the sealing of the pore structures, this may be acceptable where alternative sealing methods (e.g., silicate sealing, etc.) is implemented. Furthermore, other ions such as acetates, oxalates, citrates, carbonates or nitrates may be utilized instead of sulfate anions to achieve slow uptake of dye particles into the pore structures 212.

According to some embodiments, the use of $ZnSO_4$ may be preferable as a source of anions 224 for dyeing the anodized part 210. In particular, divalent metal cations 226 included within $ZnSO_4$ are preferable for use during the dyeing process to other sources of anions 224, such as $Na_2SO_4$. Indeed, monovalent ions, such as sodium ($Na^+$), have been found to have deleterious effects on the performance of the hydrothermal seal of the pore structures and the anodized layer. In particular, anodized layers that include monovalent ions deposited within pore structures have lower impedance values relative to anodized layers that include divalent metal cations 226. Indeed, higher impedance values indicate lower susceptibility to corrosion. When $Na_2SO_4$ is added to the dye solution, the presence of sodium ions that is sealed within the anodized layer provides a relatively mobile species for ionic conduction through the anodized layer to reach the metal substrate 204. Moreover, the presence of sodium ions may degrade the hydrothermal seal performance by about 50% due to a reduction in impedance of the anodized layer. This reduction in impedance allows for greater conductivity of corrosion-causing ions (e.g., chloride ions) to pass through the anodized layer. Consequently, degrading the hydrothermal seal renders the anodized layer more susceptible to corrosion when exposed to external contaminants (e.g., saltwater during a surf session). This degradation in the hydrothermal seal performance may be attributed to the incorporation of sodium ions into the pore structures.

According to some embodiments, although the dyed part 220 includes a limited number of divalent metal cations 226 within the metal oxide layer 206, it should be noted that there are substantially fewer divalent metal cations 226 retained within the metal oxide layer 206 when using divalent ions as a source of sulfate ions ($ZnSO_4$) instead of using monovalent ions as a source of sulfate ions (e.g., $Na_2SO_4$). Indeed, by using $ZnSO_4$ as a source of sulfate ions in the dye solution, when compared to $Na_2SO_4$, an equivalent concentration of the sulfate ions can be achieved in the dye solution with only half of the concentration of corresponding cations. Beneficially, the use of $ZnSO_4$ as a source of sulfate ions (or other divalent metal cations) leads to lower levels of cation retention within the metal oxide layer 206, and lower levels of ionic mobility or ion conductivity through the metal oxide layer 206. It should be noted that the use of divalent metal cations compared to monovalent metal ions may impart equivalent or better reduction of dye particles 222 uptake by the pore structures 212.

Furthermore, the impedance of the metal oxide layer 206 as measured in Ω is attributed to the presence of pore structures 212. In contrast, the barrier layer (not illustrated) between the metal oxide layer 206 and the metal substrate 204 does not include pore structures 212, and is not as susceptible to low impedance. When measuring the impedance of the metal oxide layer 206 of the dyed part 220 that includes divalent metal cations 226 (e.g., zinc, etc.), the impedance of the dyed part 220 does not reduce between t0 and t24 immersion measures, indicating that the metal oxide layer 206 is not as susceptible to corrosion during long-term exposure of the dyed part 220 to external contaminants (e.g., moisture, chlorine, salt, etc.). In contrast, dyed parts having metal oxide layers that include monovalent metal cations (e.g., sodium, etc.) demonstrate reduced impedance as a result of long-term exposure to external contaminants. As previously described herein, higher impedance values indicate lower susceptibility to corrosion.

Figure 2D:
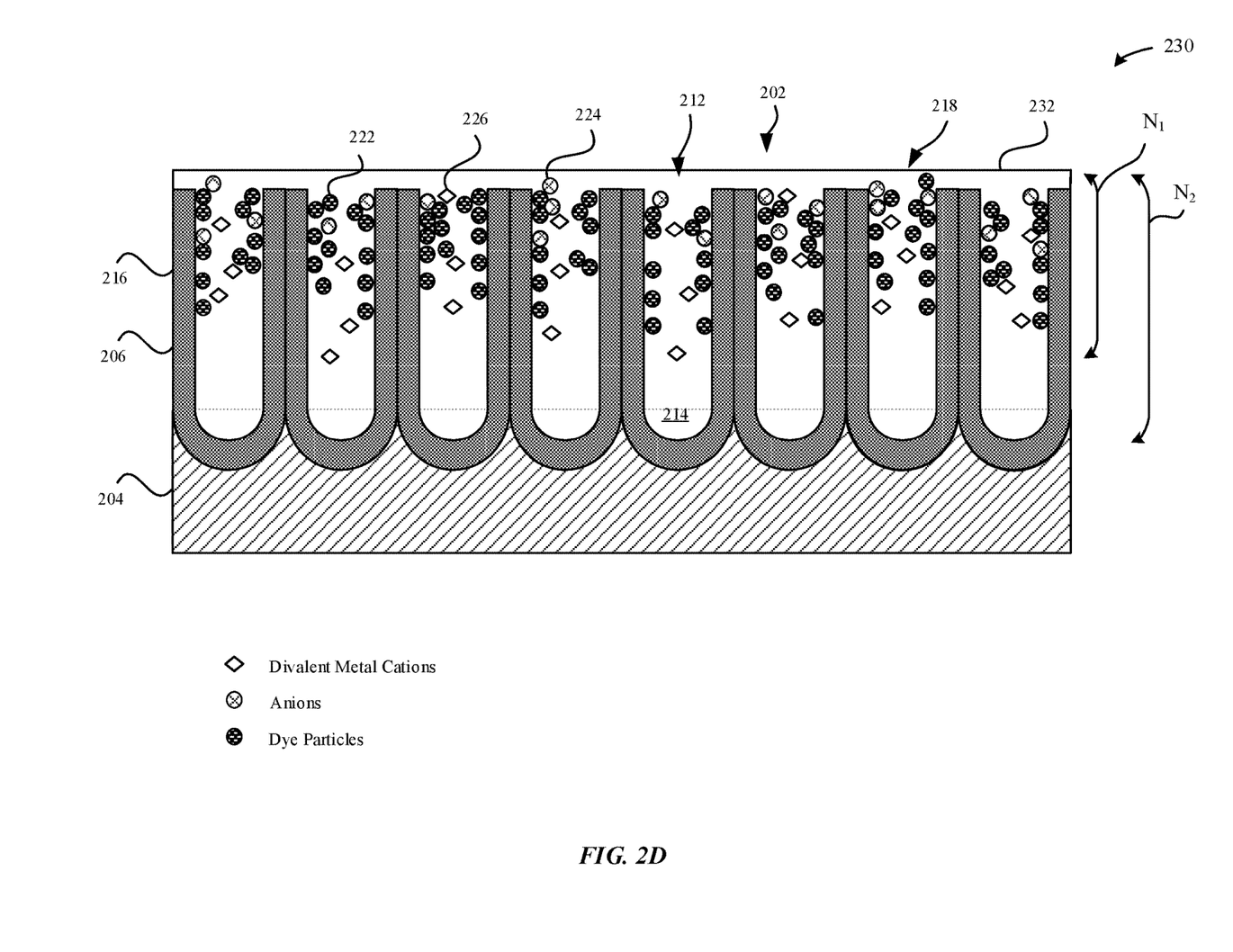

FIG. 2D illustrates a sealed dyed part 230, in accordance with some embodiments. In some examples, the sealed dyed part 230 corresponds to the dyed part 220 after undergoing a hydrothermal sealing process. During the hydrothermal sealing process, the dyed part 220 is exposed to a sealing solution so as to cause precipitation of hydrated aluminum oxide (e.g., boehmite, etc.). In particular, the hydrothermal sealing process causes swelling of the aluminum oxide of the metal oxide layer 206 while immersed in the sealing solution. The openings 218 to the pore structures 212 are closed off with a seal 232. Swelling of the aluminum oxide causes the openings 218 to narrow, thereby minimizing external elements from diffusing into the pore structures 212. Swelling of the openings 218 may also cause oxidized fragments or metal oxide material to be retained within the metal oxide layer 206. In particular, the alumina (of aluminum oxide) of the pore walls 216 is converted to aluminum oxide hydroxides (e.g., boehmite, diaspore, etc.) that results in swelling or volume increase of the oxide particles to partially close or partially seal the openings 218 of the pores 212.

According to some examples, the dyed part 220 is subjected to a sealing solution that includes immersion in a solution of 5% nickel acetate at 95° C. to 100° C. for 5-50 minutes.

The sealed dyed part 230 of FIG. 2D illustrates that the openings 218 of the pore structures 212 are sealed off with the seal 232 such as to prevent external contaminants from diffusing through the pore structures 212 to reach the metal substrate 204. However, it should be noted that the presence of monovalent ions, such as $Na^+$ incorporated from $Na_2SO_4$, within the pore structures 212 may compromise the long-term performance of the seal 232. In particular, as previously described herein, the monovalent ions deposited within pore structures 212 were measured to have lower impedance values relative to anodized layers that include divalent metal cations 226. For instance, higher impedance values indicate lower susceptibility to corrosion. When monovalent ions, such as sodium ($Na^+$) are present in the metal oxide layer 206, the overall impedance of the metal oxide layer 206 decreases, thereby reducing the resistance to corrosion-causing anions, such as chloride ($Cl^-$), which means there is greater susceptibility for these anions to pass through the metal oxide layer 206. In contrast, the presence of divalent metal cations 226 within the pore structures 212, such as zinc ($Zn^{2+}$), show increased impedance values.

In some embodiments, the divalent metal cations 226 progressively fills the pore structures 212 such that there is a divalent metal cation gradient throughout the thickness of the metal oxide layer 206. Since zinc has increased impedance properties relative to the metal oxide material, the metal oxide layer 206 is characterized as having an ionic conductivity and/or impedance gradient due to the gradient of zinc added therein. During the dyeing process, the divalent metal cations 226 may diffuse into the pore structures 212 and restrict the openings 218 of the pore structures 212, thereby preventing other divalent metal cations from diffusing any deeper into the pore structures 212. As such, the gradient corresponds to the concentration of the divalent metal cations 226 in the pore structures 212 drops sharply away from the external surface 202. For example, FIG. 2D illustrates that the pore structures 212 have a pore length of $N_2$, and the divalent metal cations 226 have a penetration depth of $N_1$, where $N_2 > N_1$. According to some examples, the metal oxide layer 206 includes between about 1 wt % to about 10 wt % of divalent metal cations 226. Moreover, it should be noted that these divalent metal cations 226 illustrated in FIG. 2D are independent of any ions contributed by the metal substrate 204 during the anodization process. Furthermore, it should be noted that the concentration of divalent metal cations 226 included in the metal oxide layer 206 is minimally affected regardless of the concentration of divalent metal cations 226 present in the metal substrate 204. For example, if the metal substrate 204 includes 5.5% zinc, there would be a maximum of 1% of zinc incorporated into the metal oxide layer 206 from the metal substrate 204.

In addition to impedance tests, as previously described herein, the integrity of the seal 232 of the sealed dyed part 230 may also be measured using electrochemical impedance spectroscopy (EIS). For example, a first EIS scan may be performed on pristine sealed dye part samples (i.e., no corrosion), followed by leaving these samples in a medium (e.g., 3.5 wt % NaCl at 30° C. for about 24 hours). Subsequently, a second EIS scan is performed on these samples. The magnitude of the reduction in impedance after the 24-hour immersion period is a measure of these samples' susceptibility to corrosion in the medium. It should be noted that dyed sealed parts that utilize monovalent cations (e.g., sodium, etc.) demonstrated about a 50% degradation in seal 232 performance subsequent the impedance tests.

Figure 3:
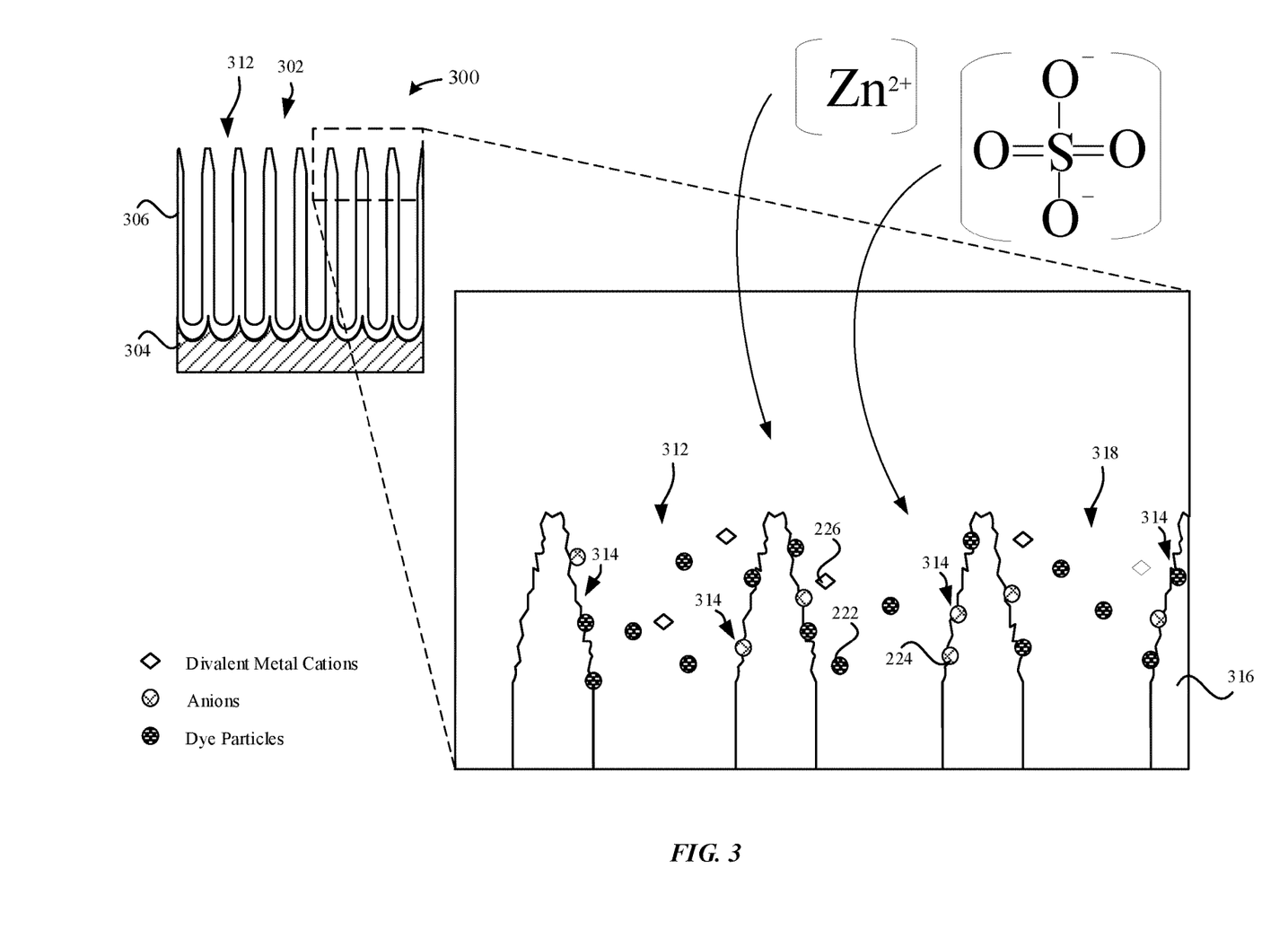
FIG. 3 illustrates a schematic diagram of a cross-sectional view of an anodized part during a dyeing process, in accordance with some embodiments.

FIG. 3 illustrates a schematic diagram of a cross-sectional view of an anodized part 300 while absorbing dye, in accordance with some embodiments. In some examples, the anodized part 300 having an etched external surface 302 is illustrated in FIG. 3. The anodized part 300 may include a metal oxide layer 306 that overlays a metal substrate 304. The anodized part 300 is exposed to a dye solution during the dyeing process. The dye solution may include dye particles 222, anions 224, and divalent metal cations 226, as previously described with reference to FIGS. 2C-2D. In particular, the dye particles 222 are capable of binding to sites 314 along pore walls 316 of the pore structures 312. However, as previously described herein, the dye solution also includes anions 224 (e.g., sulfate anions, etc.) that compete with the dye particles 222 for the sites 314. Beneficially, this competition for the sites 314 limits the number of sites 314 that are available to bind to and absorb the dye particles 222, thereby reducing uptake of the dye particles 222 in the pore structures 312. In some examples, these anions 224 may include at least one of acetates, oxalates, citrates, carbonates, or nitrates. The dye solution may include a combination of the dye particles 222 and a source of the sulfate ions.

The pore walls 316 include multiple sites 314 that are capable of receiving the dye particles 222 and/or the anions 224. Additionally, it has been found that divalent metal cations 226 (relative to monovalent metal cations) included within the dye solution may further delay uptake of the dye particles 222 into the pore structures 312 relative to monovalent metal cations. Beneficially, the use of divalent metal cations 226 enables a smaller concentration of the inhibited anions 224 to be incorporated into the dye solution in order to yield equivalent dye results. As illustrated in FIG. 3, divalent metal cations 226 (e.g., zinc) become absorbed within the pore structures 312 during the dyeing process. It should be noted that as a result of the dyeing process, the divalent metal cations 226 are non-uniformly distributed throughout the pore structures 312. In some embodiments, the concentration of the divalent metal cations 226 is greater at the openings 318 of the pore structures 312 and the concentration tapers off towards the bottom surfaces of the pore structures 312. According to some examples, the metal oxide layer 306 includes between about 1 wt % to about 5 wt % of divalent metal cations 226, such as zinc ions. In some examples, the divalent metal cations 226 may have a peak concentration at the etched external surface 302 of the metal oxide layer 306 of about 5 wt %.

Figure 4:
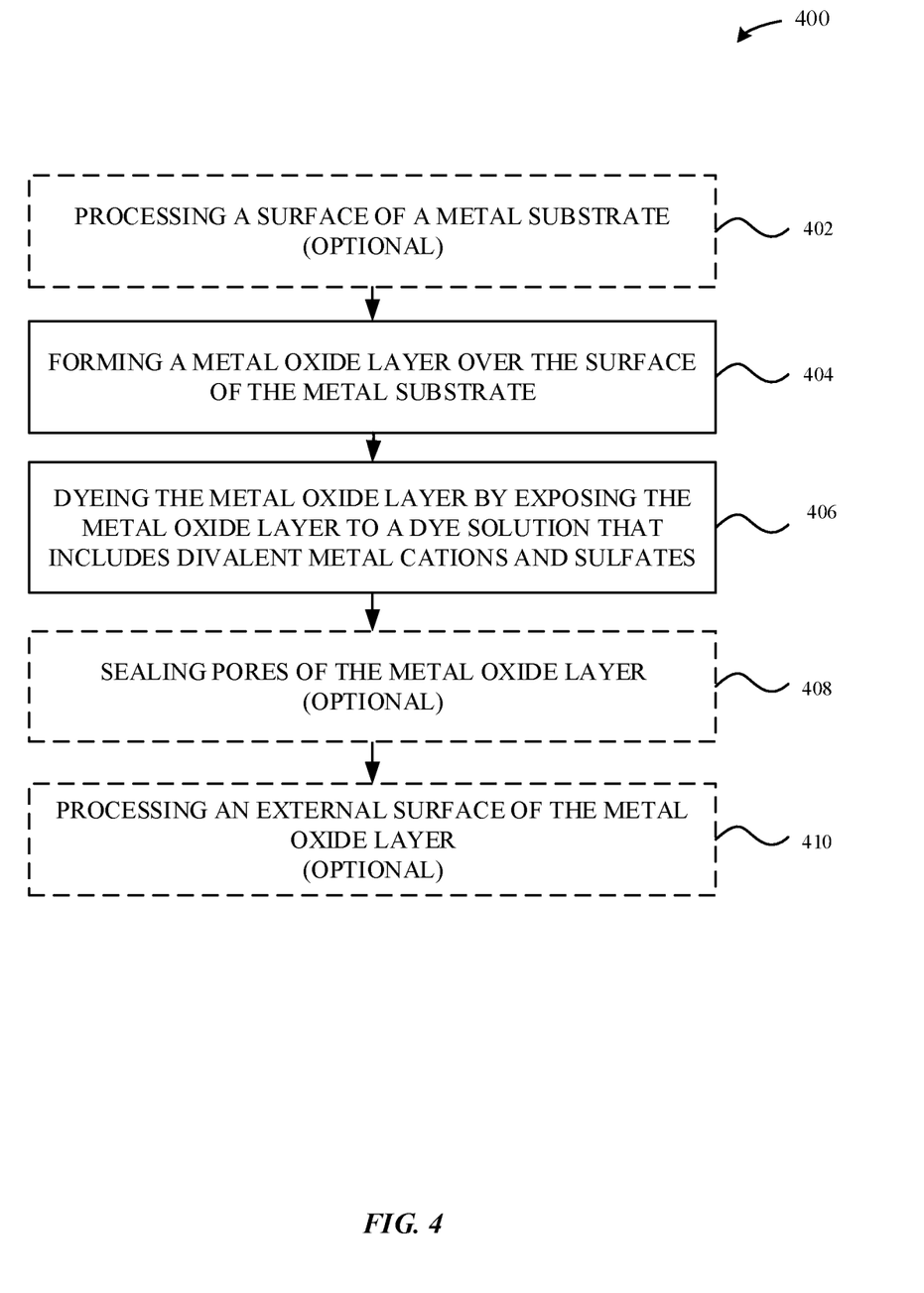
FIG. 4 illustrates a method for controlling dye uptake by a metal part in order to increase corrosion resistance, in accordance with some embodiments.

FIG. 4 illustrates a method 400 for controlling dye uptake of a metal part in order to increase corrosion resistance, in accordance with some embodiments. As illustrated in FIG. 4, the method 400 can optionally begin at step 402, where a surface of a part—e.g., a metal substrate 204—is optionally processed. In some examples, the surface of the metal substrate 204 is subject to a cleaning process, a texturizing process, an etching process, or a polishing process. In particular, the texturizing process can be beneficial in providing a roughened external surface that can promote growth of the metal oxide layer 206 at those roughened regions.

At step 404, an anodization step is performed on the metal substrate 204. Subsequent to the anodization process, an anodized part 210 including a metal oxide layer 206 is formed from the metal substrate 204. In some examples, the metal oxide layer 206 may be formed through a thermal oxidation process or an electrolytic anodization process. The metal oxide layer 206 may be formed over a surface of the metal substrate 204.

At step 406, the metal oxide layer 206 is dyed during a dyeing process. During the dyeing process, the anodized part—e.g., the anodized part 210—is exposed to a dye solution bath. The anodized part 210 is submerged within the dye solution bath that includes a divalent metal cation source of sulfate anions. According to some examples, the dye solution includes between about 0.1 g/L to about 1 g/L of $ZnSO_4$. In some examples, the dye solution includes between about 0.11 g/L to less than 10 g/L of $ZnSO_4$. Beneficially, the low concentration of the source of sulfate ions within the dye solution can slow the uptake of the dye particles 222 into the pore structures 212. By slowing the uptake of the dye particles 222, there is increased control of the color and uniformity of color among multiple parts that are exposed as a single batch to the dye solution.

According to some embodiments, the anodized part 210 is exposed to the dye solution at a temperature between 20° C. to about 60° C. In other embodiments, the anodized part 210 is exposed to the dye solution at a temperature as low as 15° C. According to some embodiments, the anodized part 210 is exposed to the dye solution for about 1 minute. In particular, when the anodized part 210 is being dyed a light color (e.g., L* value between 50 and 100), a combination of low dye concentration (i.e., 0.1 g/L to 10 g/L, etc.) with a low temperature may necessitate immersion times of 1 minute or less. In some examples, use of the dye solution slows/prolongs dye uptake of the anodized part 100 from about 100 seconds to about 180 seconds. Beneficially, slowing the dye particles 222 uptake into the pore structures 212 results in more uniform distribution of color at the metal oxide layer 206 across many parts. For instance, these delayed dye uptake techniques reduce color variation of dyed parts in a single batch to X<0.7 DE94. In contrast, dyed parts without the delayed dye uptake show a color variation across a single batch of X>1 DE94. It should be noted that these techniques are even more critical where the metal oxide layer 206 is dyed to have an L* value between 50 and 100 as measured using a CIE L*a*b* color space measurement.

At step 408, the pore structures 212 of the dyed part 220 are optionally sealed via a sealing process according to some embodiments. In some instances, sealing the pore structures 212 may be preferable in that sealing closes the pore structures such that dye particles 222 are retained within the metal oxide layer 206. In some examples, the pore structures 212 the aluminum oxide is hydrated during the sealing process. As a result, the aluminum oxide is converted to aluminum oxide hydroxide. Moreover, this process of hydrating the aluminum oxide hydrates the pore walls 216 of the pore structures 212, thereby increasing the structural integrity of the metal oxide layer 206.

In some examples, the sealing solution is hot aqueous solution (e.g., greater than 80° C.). In some examples, the metal oxide layer 206 is exposed to a 5 g/l solution of nickel acetate at a temperature of 97° C. for a duration of 25 minutes.

At 410, the sealed dyed part 230 is optionally processed according to a post-processing technique, in accordance with some embodiments. The post-processing technique can include at least one of polishing, buffering, cleaning, and the like.

Figure 5:
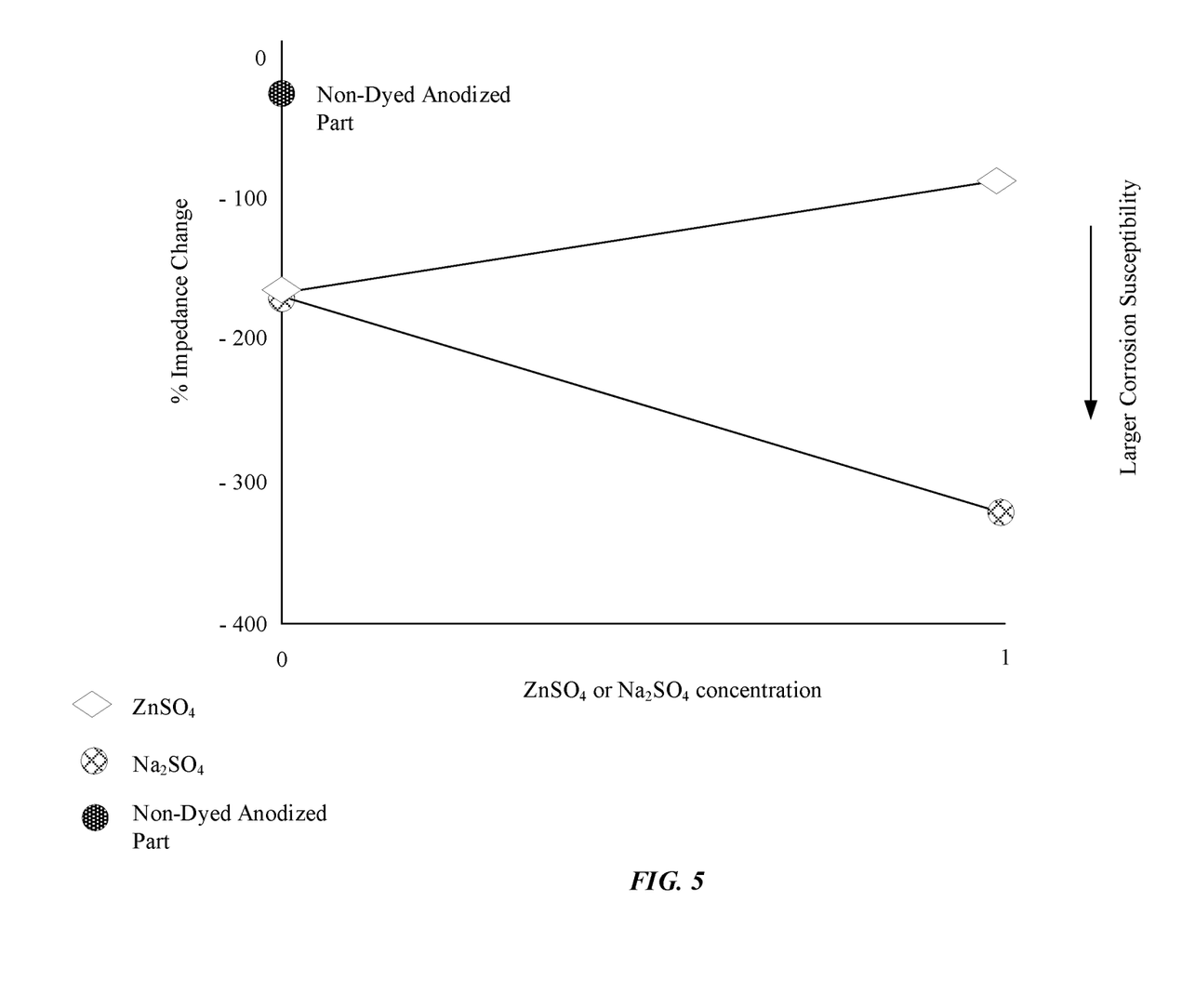
FIG. 5 illustrates a graph indicating a relationship of % impedance change as a function of sulfate ion source concentration, in accordance with some examples.

FIG. 5 illustrates a graph indicating a relationship of % impedance change as a function of sulfate ion source concentration, in accordance with some examples. As previously described herein, higher impedance values indicate lower susceptibility to corrosion. In particular, the graph of FIG. 5 indicates a causal relationship between the sulfate ion source concentration and susceptibility of the metal oxide layer to corrosion. In accordance with some exemplary trials, anodized parts that were dyed using $ZnSO_4$ as a source of sulfate anions were compared to anodized parts that were dyed using $Na_2SO_4$ as a source of sulfate anions. Both types of anodized parts were submerged in a 3.5% NaCl solution for 24 hours.

As illustrated in FIG. 5, these anodized parts were compared to a non-dyed anodized part. Samples dyed using $Na_2SO_4$ as a source of sulfate anions exhibited a significant deduction in impedance value as the concentration of $Na_2SO_4$ in the dye solution increased. In particular, samples dyed with 0.1 g/L concentration of $Na_2SO_4$ had an impedance change from the non-dyed anodized part of about −180%, and samples dyed with 1 g/L concentration of $Na_2SO_4$ had an impedance change from the non-dyed anodized part of about −320%. Thus, the decrease in impedance value demonstrates greater corrosion susceptibility of the anodized parts dyed with $Na_2SO_4$.

In contrast, samples dyed using $ZnSO_4$ as a source of sulfate anions exhibited an unexpected improvement an increase in impedance value as the concentration of $ZnSO_4$ increased. In particular, samples dyed with 0.1 g/L concentration of $ZnSO_4$ had an impedance change from the non-dyed anodized part of about −175%, and samples dyed with 1 g/L concentration of $ZnSO_4$ had an impedance change from the non-dyed anodized part of about −90%. Thus, the decrease in impedance value demonstrates decreased corrosion susceptibility of the anodized parts dyed with $ZnSO_4$.

Figure 6:
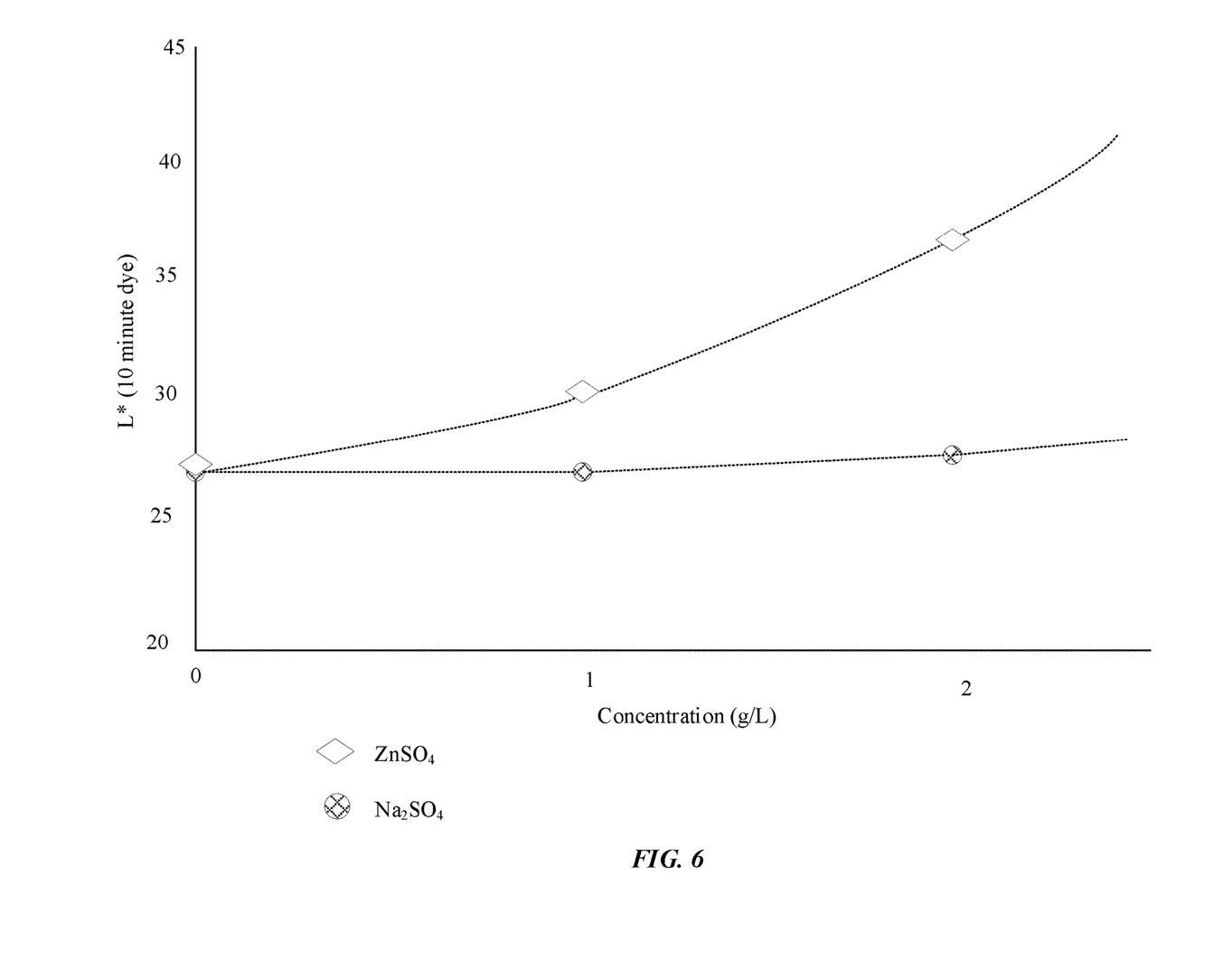
FIG. 6 illustrates a graph indicating a relationship of L* value of dyed anodized parts as a function of concentration of sulfate ions, in accordance with some examples.

FIG. 6 illustrates a graph indicating a relationship of L* value of dyed anodized parts as a function of concentration of sulfate ions, in accordance with some examples. The dyed anodized parts of FIG. 6 were dyed using a 10 minute dye.

In particular, FIG. 6 illustrates that dyed anodized parts using $ZnSO_4$ as a source of sulfate anions exhibited improvements in delaying dye uptake relative to those dyed anodized parts using $Na_2SO_4$ as a source of sulfate anions. Indeed, FIG. 6 illustrates the unexpected result that increasing the concentration of $ZnSO_4$ in the dye solution actually reduces dye uptake of dye particles 222 within the pore structures 212. The delay in dye uptake is often necessary to impart lighter shades of color to dyed anodized parts. This benefit is especially noteworthy when dyeing anodized parts with lighter colors (e.g., yellow, pink, etc.) as the L* increases (>L*=40) when the concentration of $ZnSO_4$ is 2 g/L or greater.

In contrast, dyed anodized parts using $Na_2SO_4$ as a source of sulfate anions did not demonstrate a significant improvement in delayed dye uptake of dye particles 222 within the pore structures 212. Indeed, there was no increase in L* value of the dyed anodized parts as the concentration of $Na_2SO_4$ increased. In other words, dyed anodized parts using $Na_2SO_4$ were more saturated with dye particles.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
    an aluminum alloy substrate; and
    an anodized layer overlaying and formed from the aluminum alloy substrate, the anodized layer defining pores, at least some of the pores containing:
        dye particles that impart the anodized layer with a color, wherein the dye particles are bonded to binding sites at pore walls defining the pores;
        divalent metal cations non-uniformly distributed throughout the pores; and
        anions that occupy at least some of the binding sites;
    the anodized layer comprising between about 1 weight % to about 10 weight % of the divalent metal cations.

2. The enclosure for the portable electronic device of claim 1, wherein the color of the anodized layer in a CIE L*a*b* color space has an L* value between 50 and 100.

3. The enclosure for the portable electronic device of claim 1, wherein the divalent metal cations comprise at least one of barium, calcium, cobalt, copper, germanium, iron, lanthanum, magnesium, manganese, nickel, strontium, tin, uranium, vanadium, yttrium, or zinc.

4. The enclosure for the portable electronic device of claim 1, wherein the anions comprise at least one of sulfates, phosphates, or silicates.

5. The enclosure for the portable electronic device of claim 1, wherein the anodized layer comprises a peak concentration of the divalent metal cations that is about 5 weight % or less.

6. An enclosure for a portable electronic device having a dyed color, the enclosure comprising:
    a metal substrate; and
    a metal oxide layer overlaying the metal substrate and defining pores, the metal oxide layer comprising dye particles and anions that are bonded to binding sites at pore walls defining the pores, and divalent metal cations that are non-uniformly dispersed within the pores, the metal oxide layer having an L* value in a CIE L*a*b* color space between 50 to 100, wherein the anions that are bonded to the binding sites limit the number of the binding sites available for bonding to the dye particles.

7. The enclosure of claim 6, wherein a concentration of the divalent metal cations within the pores decreases from an external surface of the metal oxide layer and towards the metal substrate.

8. The enclosure of claim 6, wherein the anions comprise at least one of acetates, oxalates, citrates, carbonates, or nitrates.

9. The enclosure of claim 6, wherein the divalent metal cations comprise at least one of barium, calcium, cobalt, copper, germanium, iron, lanthanum, magnesium, manganese, nickel, strontium, tin, uranium, vanadium, yttrium, or zinc.

10. The enclosure of claim 6, wherein the metal oxide layer comprises between about 1 weight % to about 10 weight % of the divalent metal cations.

11. A method for dyeing an enclosure for a portable electronic device, the enclosure comprising a metal substrate and a metal oxide layer overlaying the metal substrate, the method comprising:
    forming a dyed metal oxide layer by exposing the metal oxide layer to a dye solution that comprises dye particles, and divalent metal cation—anion molecules, thereby causing divalent metal cations to be non-uniformly dispersed throughout pores defined by the metal oxide layer, the dyed metal oxide layer having a lower ionic conductivity than the metal oxide layer, the metal oxide layer having an L* value in a CIE L*a*b* color space between 50 to 100, wherein anions of the divalent metal cation—anion molecules occupy at least some binding sites at pore walls defining the pores.

12. The method of claim 11, wherein the divalent metal cations comprise at least one of barium, calcium, cobalt, copper, germanium, iron, lanthanum, magnesium, manganese, nickel, strontium, tin, uranium, vanadium, yttrium, or zinc.

13. The method of claim 11, wherein anions of the divalent metal cation—anion molecules are sulfate anions.

14. The method of claim 11, wherein the anions comprise at least one of acetates, oxalates, citrates, carbonates, or nitrates.

15. The method of claim 11, wherein a concentration of the divalent metal cation—anion molecules is 0.1 g/L-1 g/L of the dye solution.

* * * * *